US009181616B2

(12) United States Patent
Evans et al.

(10) Patent No.: US 9,181,616 B2
(45) Date of Patent: Nov. 10, 2015

(54) CHROMIUM-BASED REFLECTIVE COATING

(71) Applicants: SMR Patents S.a.r.l., Luxembourgh (LU); University of South Australia, Adelaide (AU)

(72) Inventors: Drew Raymond Evans, Mawson Lakes (AU); Kamil Zuber, Parafield Gardens (AU); Colin James Hall, Brighton (AU); Simon David Field, Flagstaff Hill (AU)

(73) Assignees: SMR Patents S.a.r.l., Luxembourg (LU); University Of South Australia, Adelaide, South Australia (AU)

( * ) Notice: Subject to any disclaimer, the term of this patent is extended or adjusted under 35 U.S.C. 154(b) by 0 days.

(21) Appl. No.: 14/374,376

(22) PCT Filed: Jan. 24, 2013

(86) PCT No.: PCT/AU2013/000047
§ 371 (c)(1),
(2) Date: Jul. 24, 2014

(87) PCT Pub. No.: WO2013/110122
PCT Pub. Date: Aug. 1, 2013

(65) Prior Publication Data
US 2015/0010770 A1 Jan. 8, 2015

(30) Foreign Application Priority Data
Jan. 24, 2012 (AU) ............................... 2012900267

(51) Int. Cl.
*B32B 15/08* (2006.01)
*C23C 14/20* (2006.01)
(Continued)

(52) U.S. Cl.
CPC ........... *C23C 14/205* (2013.01); *C23C 14/0015* (2013.01); *C23C 14/024* (2013.01);
(Continued)

(58) Field of Classification Search
CPC .... C23C 14/205; C23C 14/20; C23C 14/228; C23C 14/35; C23C 14/024; C23C 14/025; C23C 14/34; C23C 14/14; C23C 14/24; C23C 30/00; C23C 14/0015; C22C 28/00; Y10T 428/265; Y10T 428/12; Y10T 428/12569; Y10T 428/12847
USPC .................. 428/544, 336, 626, 666; 420/428
See application file for complete search history.

(56) References Cited

U.S. PATENT DOCUMENTS 4,101,698 A 7/1978 Dunning et al.
5,377,045 A * 12/1994 Wolfe et al. ................... 359/585
(Continued)

FOREIGN PATENT DOCUMENTS

EP 1305373 B1 9/2008
GB 1504814 3/1978

OTHER PUBLICATIONS

Takanashi et al., "Antiferromagnetic Exchange Coupling and Magnetoresistance of Fe/Cr Multilayers: Influence of Third Elements in CR Layers," J. Phys. Soc. Japan, vol. 61, No. 11, Nov. 1992, pp. 4148-4154.*
PCT Written Opinion of the International Searching Authority, Application No. PCT/AU2013/000047, dated Feb. 21, 2013.

*Primary Examiner* — Michael E La Villa
(74) *Attorney, Agent, or Firm* — MacMillan, Sobanski & Todd, LLC

(57) ABSTRACT

A chromium-based reflective coating for a polymeric substrate, wherein the coating has a thickness of 200 nm or less and is an alloy of chromium and a dopant material, the dopant material being selected from the hexagonally close-packed transition metals, the alloy having a crystal structure of a primary body-centered cubic phase in coexistence with a secondary omega hexagonally close-packed phase.

19 Claims, 4 Drawing Sheets

(51) Int. Cl.
  *C23C 14/22* (2006.01)
  *C23C 14/35* (2006.01)
  *C22C 28/00* (2006.01)
  *C23C 30/00* (2006.01)
  *C23C 28/00* (2006.01)
  *C23C 14/02* (2006.01)
  *C23C 14/00* (2006.01)

(52) U.S. Cl.
  CPC .............. *C23C 14/20* (2013.01); *C23C 14/228* (2013.01); *C23C 14/35* (2013.01); *C23C 28/00* (2013.01); *C23C 30/00* (2013.01); *Y10T 428/12* (2015.01); *Y10T 428/12569* (2015.01); *Y10T 428/12847* (2015.01); *Y10T 428/265* (2015.01)

(56) References Cited

U.S. PATENT DOCUMENTS

| | | | |
|---|---|---|---|
| 6,416,194 | B1 | 7/2002 | Demiryont |
| 6,586,048 | B2 | 7/2003 | Welch, Jr. et al. |
| 6,586,098 | B1 | 7/2003 | Coulter et al. |
| 6,699,313 | B2 | 3/2004 | Coulter et al. |
| 6,906,257 | B2 | 6/2005 | Saccomanno et al. |
| 2002/0187350 | A1 | 12/2002 | Saccomanno et al. |
| 2003/0134151 | A1* | 7/2003 | Usuki et al. .................. 428/693 |
| 2003/0141096 | A1 | 7/2003 | Saccomanno |
| 2003/0207113 | A1 | 11/2003 | Coulter et al. |
| 2005/0008848 | A1 | 1/2005 | Saccomanno et al. |

* cited by examiner

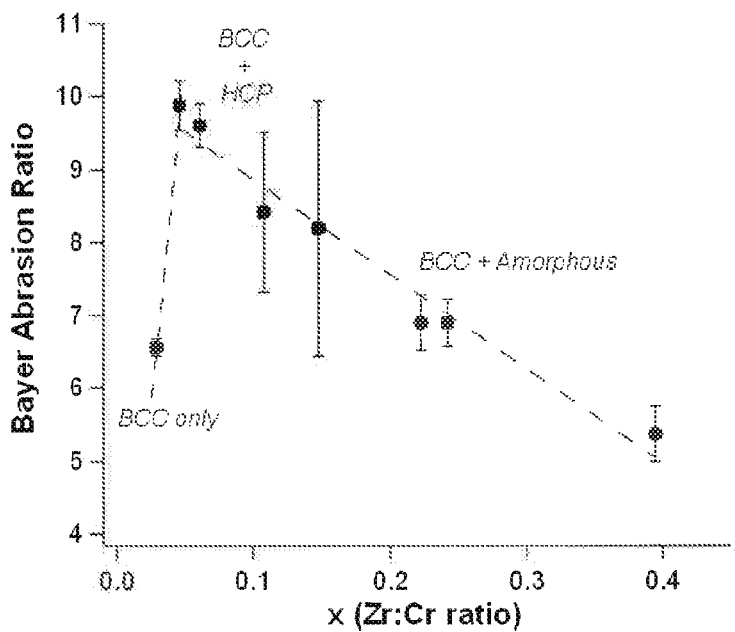
Figure 4
Figure 5
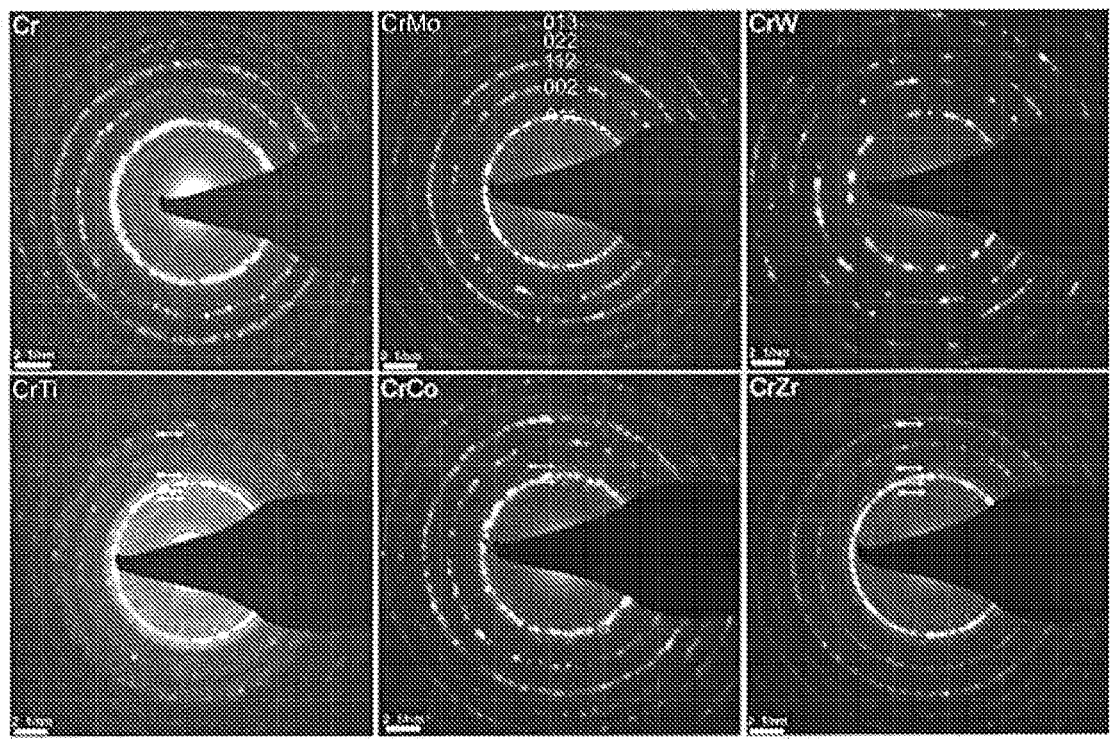

CHROMIUM-BASED REFLECTIVE COATING

This application claims priority from Australian provisional patent application 2012900267 filed on 24 Jan. 2012, the contents of which are to be taken as incorporated herein by this reference.

FIELD OF THE INVENTION

The present invention relates to reflective coatings, particularly chromium-based coatings, for polymeric substrates, being coatings that are able to provide good abrasion resistance with a neutral colour. The present invention relates both to the coatings themselves and also to a method for applying the coatings to polymeric substrates.

BACKGROUND OF THE INVENTION

Polymeric materials have many advantages in both commercial and industrial applications compared to traditional materials such as glass. Typically they afford their user design freedom and advantageous properties such as decreased weight and reduced cost of production. An interesting area of application for the surface engineering of polymeric substrates is the design of ultrathin coatings for use in 'everyday' environments, such as easy-clean coatings on smart phones to mirrors and decorative (colourful) coatings in the automotive industry. Prolonged exposure to these 'everyday' environmental conditions requires such ultrathin coatings to possess a level of robustness against factors such as acidic or caustic environments, temperature variations from as low as −80° C. to highs of +80° C., variations in relative humidity, as well as abrasive conditions inflicted by everyday wear and tear.

Additionally, in almost all applications employing such coatings, there is a need for the coating to maintain its integrity over extended periods of operation under varying environmental conditions. That is, the coating should not significantly change reflectivity or colour within this time, nor should it delaminate or break away from the underlying substrate.

However, the application of appropriate coatings to polymeric materials is particularly difficult given that traditional coating methods generally require substrates that can withstand high temperatures (often >150° C.). As most common polymeric materials have relatively low softening temperatures, there is a paucity of appropriate coatings for these substrates.

To date the majority of work on the development of robust abrasion-resistant ultrathin coatings has thus focussed on the deposition of hard compounds such as borides, carbides and nitrides to hard/heat-resistant substrates such as metal and ceramics. However, the high temperatures used in the deposition techniques are inappropriate for use on polymeric substrates. Therefore, there is a need for ultrathin coatings that can be applied to polymeric substrates with relatively low softening temperatures, which are still capable of delivering desired physical properties such as abrasion resistance, reflectivity (preferably with a R % greater than 50%) and neutral (or a desired) colour.

With specific regard to colour, reference throughout this specification to a "neutral" colour is reference to a colour that is defined by measured L*, a* and b* values in accordance with the 1976 CIE L*a*b* Space (or CIELAB) colour model, which is an approximately uniform colour scale organised in cube form. In the orthogonal a* and b* colour axes, positive a* values are red, negative a* values are green, positive b* values are yellow and negative b* values are blue, while the vertical scale for lightness (or greyscale) L* runs from 0 (black) to 100 (white), allowing the positioning of a total colour E in three points. The Chroma (C*) of the colour is defined as $\sqrt{(a^{*+2}+b^{*+2})}$, and is used to quantify the magnitude of the colour independent of its lightness. Ideally, for the colour E to be neutral, the C* value will be less than or equal to 1 and the colour E will thus be close to the neutral L* axis.

The above discussion of background is included to explain the context of the present invention. It is not to be taken as an admission that any of the material referred to was published, known or part of the common general knowledge at the priority date of any one of the claims.

SUMMARY OF THE INVENTION

The present invention provides a chromium-based reflective coating for a polymeric substrate, wherein the coating has a thickness of 200 nm or less and is an alloy of chromium and a dopant material, the dopant material being selected from the hexagonally close-packed transition metals, the alloy having a crystal structure of a primary body-centered cubic phase in coexistence with a secondary omega hexagonally close-packed phase. In a preferred form of the present invention, the alloy is a binary alloy of chromium and the dopant material.

The present invention also provides a method of forming a chromium-based reflective coating on a polymeric substrate, the method including applying chromium and a dopant material to the polymeric substrate by physical vapour deposition, the dopant material being selected from the hexagonally close-packed transition metals, to form an alloy coating having a thickness of 200 nm or less, the alloy coating being applied so as to have a crystal structure of a primary body-centered cubic phase in coexistence with a secondary omega hexagonally close-packed phase. In a preferred form of the present invention, the alloy is applied so as to be a binary alloy of chromium and the dopant material.

Chromium is a Group 6 member of the transition metals and has a body-centred cubic (bcc) crystal structure. Incorporated as the primary component in the preferred binary alloy of the present invention, being an alloy of two principal metallic components, chromium is used primarily for its contribution towards producing a shiny, hard surface that is resistant to corrosion, thus bringing to the alloy the desirable property of optical reflectivity, preferably with an R % greater than 50% so as to find acceptable use in forming a mirror. It has a high melting point, a stable crystalline structure and moderate thermal expansion, making it an ideal primary component for use in the harsh environmental conditions described above.

The secondary component of the preferred binary alloy is the dopant material mentioned above, the dopant material herein often being referred to as M and being selected from the hexagonally close-packed (hcp) transition metals. The hcp structure is the most common among the transition metals, including the transition metals zirconium (Zr), titanium (Ti), cobalt (Co), hafnium (Hf), rubidium (Ru), yttrium (Y), and osmium (Os). In this respect, some of these hcp transition metals, such as Zr, Ti and Co are practically easier materials to work with and so will be preferred dopant materials for the purposes of the present invention.

While it is envisaged that Zr will be the most preferred hcp dopant material, and thus the present invention will be described herein mainly with reference to Zr as the hcp dopant material, this should not be regarded as a limitation on the scope of the present invention.

In a preferred form of the present invention, the alloy will be a binary alloy and the atomic percentage of the dopant material in the binary alloy will be in the range of from about 1.9 at. % to about 5.8 at. %. However, within this broad range, there may be narrower ranges that relate to specific dopant materials, as will be described further below.

It has been found that the introduction of small amounts of a hcp dopant material to the chromium (a bcc transition metal) can yield a range of alloy compositions having an intermetallic crystal structure that has bcc and omega-hcp phases coexisting, which has been found to provide those alloys with further advantageous properties (beyond those of chromium alone). Indeed, it has been found that the careful selection of the amount of hcp dopant material relative to the amount of chromium can give rise to alloy compositions within those ranges that are particularly preferred, where desirable properties (such as abrasion resistance) are maximised and undesirable properties (such as a colour other than a neutral colour) are minimised.

By way of explanation, it has been found that coatings according to the present invention change in phase composition as the elemental composition of the dopant material is increased, from bcc only, to bcc plus omega-hcp, to bcc plus an amorphous phase. The optical and mechanical properties observed for the coatings show variation commensurate with these changes in composition, with the preferred optical and mechanical properties occurring when the phase composition is bcc plus omega-hcp. Without wishing to be bound by theory, it is believed that the observed changes are due to the changing electron structure of the atoms and the crystallographic conformation relative to each other.

Specifically, when the phase composition was bcc plus omega-hcp, the crystal structure of the coatings demonstrated d-orbital transitions which gave rise to neutral colour and relatively lower reflectivity, with the well-ordered crystal structure yielding higher relative resistance to abrasion. By way of comparison, when the amorphous phase was present, the d-orbital transitions were no longer observed, indicating that the orbital hybridization between neighbouring atoms was partially filling the d-orbitals, correlating with a less-preferred lower reflectivity. Furthermore, the lower atomic packing density in such an amorphous phase was found to yield coatings with reduced resistance to abrasion, which of course is also less desirable.

With this in mind, and referring to the dopant material as M in the general formula $CrM_x$, this transition of phase from bcc plus omega-hcp, to bcc plus an amorphous phase, was found to occur at values of x of about 0.06, correlating to about 5.8 at. %, when the dopant material was Zr. The same transition is expected to occur at about the same value of x also for Ti and Co.

Unlike the reflectivity, the colour of the coatings of the present invention was found to not show a change in trend at the transition of the phase from bcc plus omega-hcp, to bcc plus an amorphous phase. To the contrary, at the transition of the phase from bcc to bcc plus omega-hcp, which was found to occur for Zr at values of x (in the above general formula) of about 0.05 (correlating to a lower limit of about 4.5 at. %), a transition in the colour of the coatings of the present invention was found. This suggests the onset of the orbital hybridization in the electron structure occurs at concentrations of Zr as the dopant material close to about 4.5 at. %. However, the same transition point for Co as the dopant material was found to be about 1.9 at. %.

By way of explanation, and again using Zr as the exemplary hcp dopant material, at low concentrations there is an increase in the resistance to abrasion upon increasing the elemental composition of Zr. A maximum in the resistance to abrasion is observed at the transition from bcc to the bcc plus omega-hcp, after which increasing the Zr concentration leads to a steady decrease in the measured abrasion ratio. Indeed, from an electron diffraction analysis of $CrZr_x$ coatings, two transition concentrations are defined that represent the change from one phase composition to another. For Zr as the dopant material, these transitions are at about x=0.05 (bcc to bcc+Ω-hcp) and about 0.06 (bcc+Ω-hcp to bcc+amorphous). In this respect, the omega-hcp phase is understood to be a displacive phase transformation from the bcc structure.

Accordingly, in one form of the present invention, the alloy will be a binary alloy and the dopant material will be Zr, wherein the atomic percentage of the dopant material in the binary alloy will be in the range of from about 4.5 at. % to about 5.8 at. %.

In yet another form of the present invention, the alloy will be a binary alloy and the dopant material will be Co, wherein the atomic percentage of the dopant material in the binary alloy will be in the range of from about 1.9 at. % to about 5.7 at. %.

In relation to predictive conclusions able to be drawn by the inventors (based on the similarity in the physical nature of all hcp transition metals) from the experimental work (described below) conducted in relation to Zr and Co, and to an extent Ti, it will be appreciated by a skilled addressee that the behaviour of the other hcp transition metals as the dopant material in the present invention can be reasonably expected to be the same or similar to that as seen with Zr, Co and Ti. Indeed, the comparative experimental work conducted (again, see below) on the bcc transition metal molybdenum (Mo), where similar behaviour was not expected (and was not seen) due to the different physical nature of this transition metal, also tends to confirm these predictive conclusions about the hcp transition metals.

Indeed, given that the physical nature of the other hcp transition metals is similar to both Zr and Co, it is expected that Ti, Hf, Ru, Y and Os will display the same structure forming abilities in the Cr based alloy of the present invention when their concentration is within the range of about 1.9 at. % to about 5.8 at. %.

The coatings of the present invention are preferably ultrathin coatings, which is being defined in this specification to be a coating with a thickness of 200 nm or less. It is envisaged that preferred thicknesses will be in the range of 100 nm or less, or more preferably in the range of 40 nm to 80 nm, or more preferably in the narrower range of 50 nm to 70 nm. Ideally, the thickness will be about 60 nm.

Preferably, the polymeric substrate is formed by injection compression moulding, although any other method known in the art, such as compression moulding, blow moulding, reaction moulding and sheet casting, could also be utilised and thus also falls within the scope of the present invention.

The polymeric substrate may be any known type of polymeric substrate material and for example could be a substrate formed from a material selected from the group including polyacrylate, polyester, polystyrene, polyethylene, polypropylene, polyamides, polyimides, polycarbonate, epoxy, phenolic, acrylonitrile-butadiene-styrene, acrylonitrile-styrene-acrylates, acetal, and blends of these. Preferred substrate materials include polycarbonate, poly (2,2'-dihydroxyphenylpropane) carbonate, polydiethyleneglycol bis(allyl carbonate), polymethylmethacrylate and polystyrene, or blends thereof.

Additionally, the polymeric substrate may consist of a polymeric substrate material which has been pre-coated with appropriate films, these films providing the substrate with suitable properties for the deposition and adhesion of the coating of the present invention. The pre-coated films include hardcoats (such as organo-silicon, an acrylic, a urethane, a melamine or an amorphous $SiO_xC_yH_z$), inorganic oxides (silica, titania, alumina), thin metal films (Cr, etc), where the pre-coated substrate has been prepared to have the desirable surface energy, residual stress, thermal coefficient of expansion, conductivity, chemical functionality, etc, as required by the specific application of such a Cr based alloy coating.

In a similar manner, a skilled addressee will understand that an overcoating may be applied over the coating of the present invention, which overcoating could include transparent coatings for the purposes of mechanical strength, wettability, optical interference filters, modified coefficient of friction, etc. Examples of overcoating function are hydrophobic/hydrophilic materials (silica, fluoropolymers), hardcoats, and inorganic oxides (silica).

In a preferred form, the physical vapour deposition techniques adopted in the method of the present invention will be based upon magnetron sputtering, be it from a primary alloy target or using a co-sputtering process involving two targets made from the respective components of the alloy. Alternatively, it will be appreciated that the preferred alloy could be deposited using thermal evaporation or e-beam evaporation of the respective alloy components.

Before turning to a description of various preferred embodiments of the present invention, it will be appreciated that, due to the nature of polymeric substrates, conventional temperature processing (during or after deposition) could not be employed to modify the properties of alloy coatings of the type of the present invention. In the inventive coatings, the inventors have determined that the preferred alloys change in phase composition as the elemental composition of a dopant material (such as Zr, Ti or Co) is increased; from bcc only, to bcc plus Ω-hcp, to bcc plus an amorphous phase. The optical and mechanical properties for these preferred alloys (as ultrathin coatings) show variation commensurate with the composition and observed changes relate to the changing electron structure of the atoms and the crystallographic conformation relative to each other.

Indeed, these crystalline ultrathin coatings demonstrate d-orbital transitions that give rise to neutral colour and relatively lower reflectivity, with a well ordered crystal structure yielding higher relative resistance to abrasion. When amorphous material is present in the coatings, the d-orbital transitions are no longer observed, indicating the partial filling of the d-orbitals. It is believed that the orbital hybridization between neighbouring atoms partially fills the d-orbitals, correlating with a yellow colour and higher reflectivity. Furthermore, the lower atomic packing density in the amorphous phase yielded coatings with reduced resistance to abrasion.

DESCRIPTION OF THE PREFERRED EMBODIMENTS

The present invention will now be described in relation to various preferred embodiments of which some aspects are illustrated by the accompanying figures, with other aspects being illustrated by the following examples as summarised in the following tables. In the figures:

FIG. 4 shows the abrasion resistance of a $CrZr_x$ coating as a function of the elemental composition of the $CrZr_x$ coating;

FIG. 5 shows diffraction patterns from a Transmission Electron Microscope for $CrM_x$ samples in accordance with embodiments of the present invention (M=Zr, Co and Ti) and for comparative purposes (M=W and Mo)

EXAMPLES

Physical Properties

Figure 1:
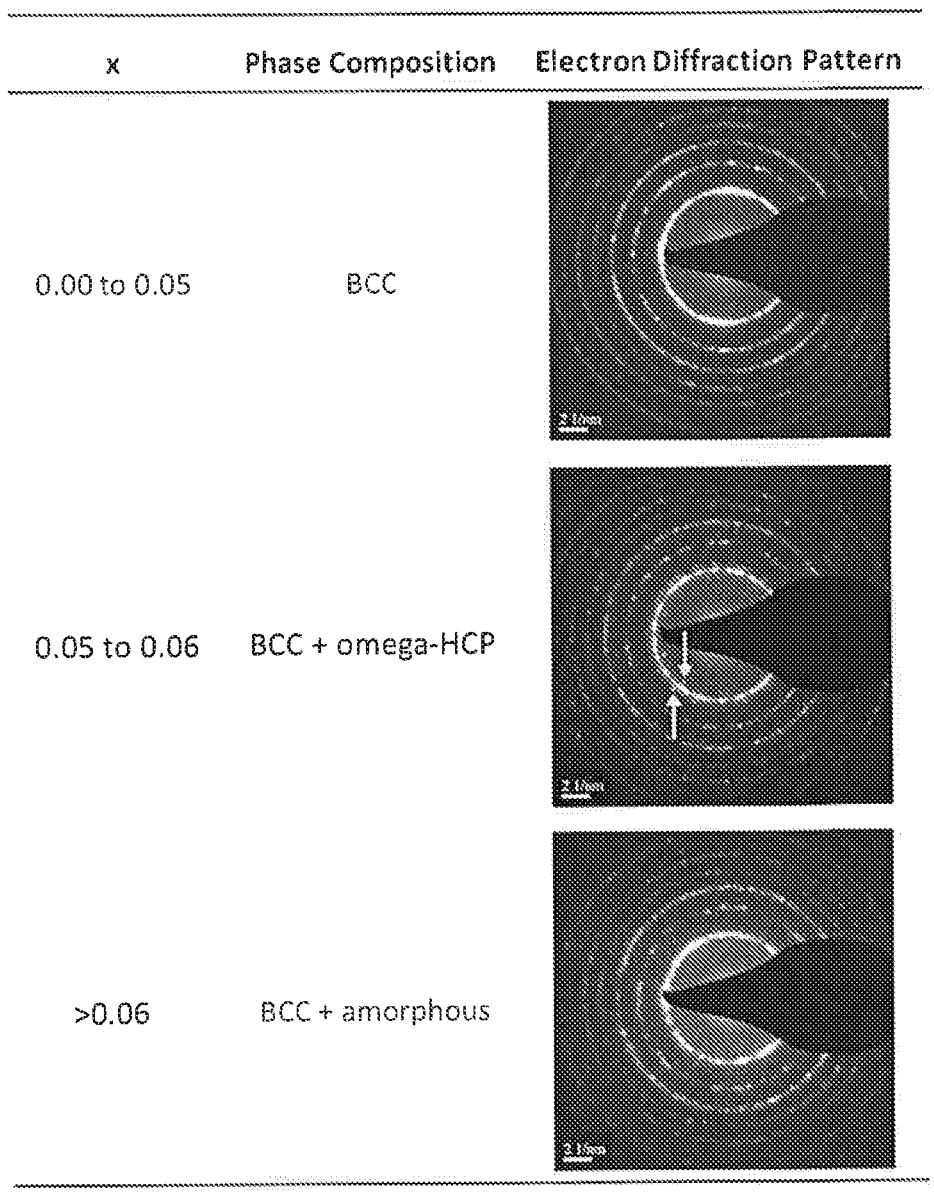
FIG. 1 shows the phase composition of a $CrZr_x$ coating as a function of its elemental composition—the presence of the Ω-hcp is represented by the diffraction highlighted with the arrows.

Experiments were conducted to form various coatings in accordance with the present invention upon polymeric substrates. In these experiments, specially prepared polymeric substrates were utilised, which themselves included coatings applied directly thereupon. Indeed, the polymeric substrates were a polycarbonate material (approximately 8 cm×8 cm squares of 0.5 cm thickness) coated with a hardcoat resin (PHC587B from Momentive Performance Materials Inc., TSR2626B from SDC Technologies Inc., or PR660/MP101 from SDC Technologies Inc.), the hardcoat then itself coated with a reactively sputtered $SiO_2$ layer.

The polymeric substrate was dip-coated at a withdrawal speed of 11 mm/s, or spin-coated at 300 revolutions per minute (rpm) for 5 seconds, and cured as per the manufacturers prescribed conditions, to thereby form the hardcoat resin layer upon the polymeric substrate. For the $SiO_2$ layer, a custom-built reactor was used to sputter a high purity Si target in an $Ar+O_2$ environment. The hardcoat resin layer and the $SiO_2$ layer had thicknesses of 5 μm and 140 nm respectively, as determined using a F20 Thin Film Analyzer by Filmetrics Inc.

The chromium-based reflective coating of the present invention was subsequently applied to the specially prepared polymeric substrates in a custom-built reactor by magnetron co-sputtering a $CrM_x$ alloy layer (where M=the hcp transition metals Zr and Co), to form a range of exemplified samples. In addition, comparative samples were prepared where M=the bcc transition metal molybdenum (Mo).

The substrates were heated to 85° C. using an infrared lamp in the custom-built reactor as the chamber was evacuated to approximately $1 \times 10^{-4}$ mbar. A co-sputtering process employing two sputter targets was used to deposit the $CrM_x$ alloy layer. The substrate holder was rotated at 60 rpm through the respective plasma's generated from a 5"×12" rectangular high purity Cr target and a 3" disc dopant material target. A sample rotation speed of 60 rpm was chosen because each pass through the plasma was calculated to deposit approximately 4 to 6 Angstrom of combined material from the targets, thus avoiding a sandwich type layer structure and achieving the preferred binary alloy coating.

A working gas of Ar was introduced at flow rates of 80 standard cubic centimeters per minute (sccm). For deposition, the Cr target was set at a constant power of 1 kW, while the dopant material target was set within the range of 25 to 100 W to define the experimental window for neutral coloured abrasion resistant alloy coatings. The final reflective coating for the samples had a $CrM_x$ film thickness in the order of 40 to 60 nm as determined by Atomic Force Microscopy imaging. The Cr:M ratios within the coatings of the samples were generated by changing the dopant material (M) deposition rate relative to the Cr, with the actual ratios achieved determined using X-ray Photoelectron Spectroscopy (XPS) analysis (Kratos Axis Ultra DLD with an Al—Kα monochromatic source).

The elemental composition, defined by x, of the ultrathin $CrM_x$ films was determined for each of the samples—see Table 1 (for Zr) and Table 2 (for Co) below for the collected data. With Zr used as the dopant material M, as the ratio between the power density applied to the Zr and Cr targets increased, there was a near linear increase in the Zr concentration in the ultrathin film. For each of the Zr samples the electron diffraction pattern was collected using TEM (see FIG. 1), and then analysed with respect to the major constituents within the film. The spot size of the electron beam was minimised to produce the clearest diffraction patterns possible for these polycrystalline ultrathin films (polycrystalline with respect to the small grain-like/columnar structures that constitute the film).

From the electron diffraction analysis of the $CrZr_x$ films, two transition concentrations are defined that represent the change from one phase composition to another. These transitions are at x=0.05 (bcc to bcc+Ω-hcp) and 0.06 (bcc+Ω-hcp to bcc+amorphous). The Ω-hcp phase is a displacive phase transformation from the bcc structure.

The optical properties of each sample were determined using a HunterLab UltraScan Pro instrument. These optical measurements were quantified by the CIELAB measures of a* and b* (as mentioned above) which embody the colour or chroma ($C^*=\sqrt{(a^{*2}+b^{*2})}$) of the captured light, be it transmitted or reflected. Also, the total photopic reflectivity (R %) of the coatings was measured.

Figure 2:
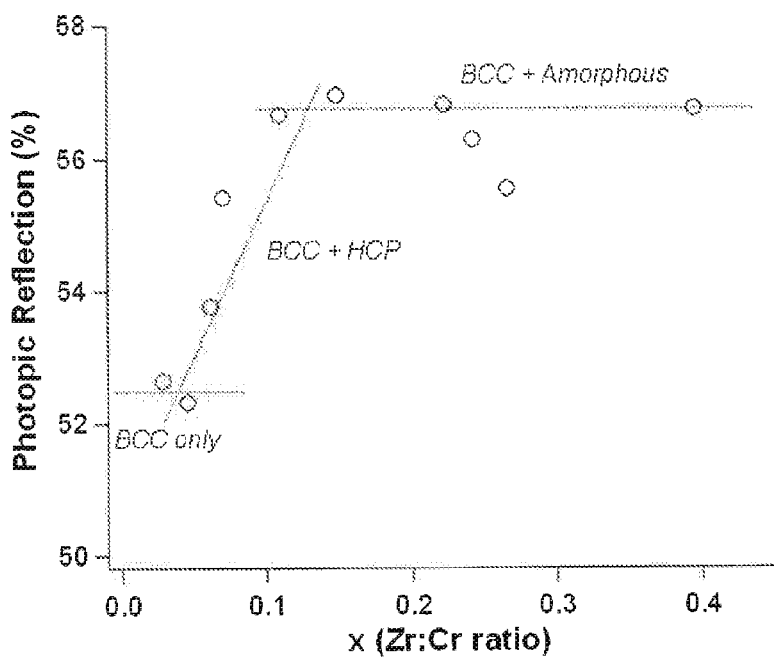
FIG. 2 shows the photopic reflectivity of a $CrZr_x$ coating as a function of the elemental composition—the optical reflectivity of the coating follows its phase composition.

With reference to Tables 1 and 2 and FIG. 2, the reflectivity was observed to change over the elemental composition range presented. More so, the optical response followed that of the phase composition of the film with observed discontinuities in the reflectivity versus elemental composition at the transition concentrations defined from the electron diffraction assignment.

Further to this change in reflectivity, at lower concentrations of Zr a maxima and minima was observed in the reflectivity as a function of photon energy. Indeed, measurement of the photon energy for the maxima and minima yielded 2.5 and 2.2 eV respectively, at concentrations up to $CrZr_{x=0.11}$. At these energy levels the observed maxima is assigned to electron transitions from the filled d-orbital bands to the empty d-orbital bands of the atoms, namely the 3→5 transition. From the electron diffraction images, the crystal structure in this concentration range was representative of the bcc structure for Cr.

The loss of the maxima and minima in the reflectivity correlates with the transition from the purely crystalline alloy films (bcc and bcc+Ω-hcp) to the crystalline plus amorphous. It is believed that in the amorphous phase the higher concentration of Zr yielded partially filled d-orbital bands of the $CrZr_x$ structure through orbital hybridization. Increased filling of the orbitals removed the d-orbital interband transitions because they were then occupied. The electron transitions that occured in the electronic structure of the atoms then occured at energies outside of the visible spectrum (>3.5 eV).

As the d-orbtial transitions were reduced and eliminated by increasing the Zr concentration, the yellow part of the visible spectrum (ca 2.15 eV) increased in reflectivity relative to the other energy regions. Thus, the samples changed in their colour intensity (chroma) from neutral to yellow when the elemental composition of Zr increased, as is apparent from FIG. 3.

Figure 3:
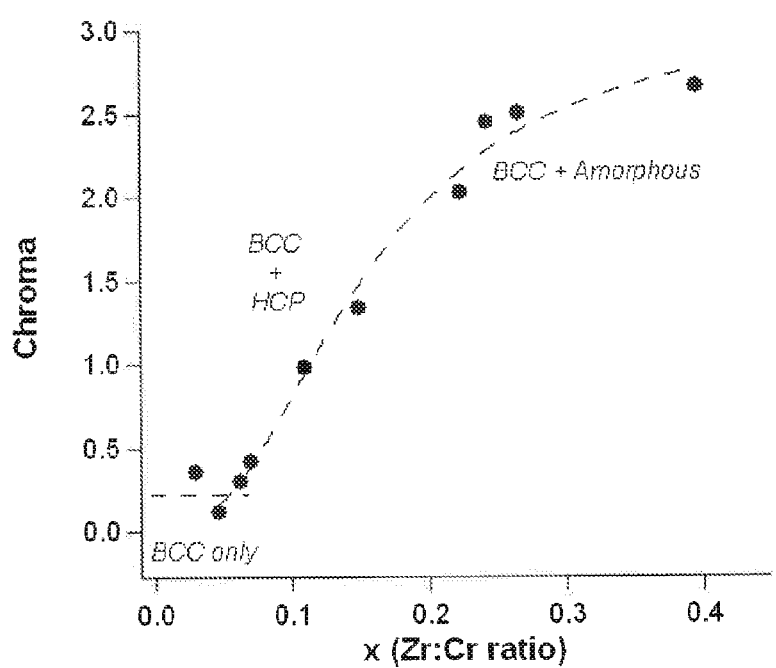
FIG. 3 shows the reflected chroma of the thin film coating as a function of the elemental composition of a $CrZr_x$ coating—chroma embodies the magnitude of the colour relative to neutral, but not the specific colour observed; the transitions between phases are not likely to be discrete at a given concentration.

Indeed, unlike the reflectivity, the chroma of the ultrathin film did not show a change in trend at the transition concentration between crystalline to crystalline plus amorphous—see FIG. 3. At the transition concentration (x=0.05) where the additional Ω-hcp is observed, there is a transition in the C* value of the ultrathin films. This suggests the onset of the orbital hybridization in the electron structure occurs at concentrations of Zr close to x=0.05

The abrasion resistance of the reflective coating of each sample was determined by employing the Bayer abrasion test. This test is employed in a variety of different industries to qualify the abrasion resistance of a coating, with the variant employed here being similar to the ASTM F735 standard for the determination of abrasion resistance of aircraft windows and ophthalmic lenses. A Taber Oscillating Abrasion Tester (model 6100) was used to subject the samples to 300 cycles (150 cycles/min) over a stroke length of 100 mm under an applied load of 0.5 kg of Alundum chips (Norton Company of Worcester Mass., USA). In this test, the abrasion resistance is quantified by the Bayer Ratio that takes account of the change in haze (or reflection haze for reflective substrates) of the sample from the abrasion, normalised against the change in haze observed for a reference sample (as per SAE J964). Haze is determined by:

Haze=$(R \%_{SE}/R \%_{SI}) \times 100$, where $R \%_{SE}$ and $R \%_{SI}$ are the reflectivity with the specular beam excluded and included respectively.

Both the sample and the reference were tested for haze using the same HunterLab UltraScan Pro instrument used for the colour and reflectivity measurements. In this study, the same type of reference material was used for determination of the Bayer Ratio (a piece of uncoated polycarbonate). The larger the determined Bayer Ratio, the greater the abrasion resistance relative to the reference sample. To reference the performance of the coating of the present invention, in situations where various pre-coating films were present as a part of the polymeric substrate, the abrasion resistance is compared to the Bayer Ratio for a chrome nitride (CrN) coating using the same pre-coated substrate, where the abrasion resistance of the CrN coating is defined as the acceptable level of abrasion resistance, and the acceptable level of abrasion resistance for embodiments of the present invention are then represented as an abrasion resistance (%) of 100%.

Again with particular reference to the samples having Zr as the dopant material M, the mechanical properties of the ultrathin $Cr:Zr_x$ films were characterised by measurement of abrasion resistance. Importantly, it was recognised that the resistance to abrasion is not solely characterised by a Cr:Zr ratio, but also by the underlying layers in a multilayer structure. Therefore, in this experimental work, the specially prepared substrates were constant within a given sample, and hence relative variations in the mechanical properties could be assigned to changes in the ultrathin $CrZr_x$ coatings.

The abrasion ratio determined by the Bayer abrasion test mentioned above is shown in Table 1 and FIGS. 4 and 6 for Zr as the dopant material, and in Table 2 and FIG. 6 for Co as the dopant material. For the purposes of comparative analysis the bcc transition metal Mo was used as the dopant.

Table 1 shows that there was an increase in the resistance to abrasion upon increasing the elemental composition of Zr. A maximum in the resistance to abrasion was observed immediately after the transition from bcc to the bcc+Ω-hcp, after which increasing the Zr concentration lead to a steady decrease in the measured abrasion ratio. Table 2 shows that the resistance to abrasion increased in line with the increase in elemental composition of Co, with the maximum abrasion resistance achieved prior to the transition from bcc+Ω-hcp to bcc+amorphous structure. For both of the dopants exemplified in Tables 1 and 2, the resistance to abrasion was greatest when the dopant was present at concentrations that resulted in a bcc+Ω-hcp structure (grey columns).

TABLE 1

|  | CrN | CrMo | CrZr$_x$ | | | | |
| --- | --- | --- | --- | --- | --- | --- | --- |
| x | — | 0.06 | 0.03 | 0.05 | 0.06 | 0.11 | 0.15 |
| Atomic Percentage (%) | — | 5.8 | 2.8 | 4.4 | 5.8 | 9.8 | 12.9 |
| Crystal Structure | fcc | bcc | bcc | bcc + Ω-hcp | bcc + Ω-hcp | bcc + amorph | bcc + amorph |
| Abrasion Resistance (%) | 100.0 | 60.0 | 73.9 | 111.4 | 109.1 | 100.0 | 87.5 |
| Chroma | 4.1 | 0.21 | 0.4 | 0.1 | 0.3 | 1.0 | 1.4 |
| Reflectivity (%) | 55.5 | 50.5 | 52.7 | 52.5 | 53.8 | 56.6 | 57.5 |

TABLE 2

|  | CrN | CrMo | CrCo$_x$ | | | | |
| --- | --- | --- | --- | --- | --- | --- | --- |
| x | — | 0.06 | 0.01 | 0.02 | 0.04 | 0.05 | 0.06 |
| Atomic Percentage (%) | — | 5.8 | 0.6 | 1.9 | 3.9 | 4.7 | 5.7 |
| Crystal Structure | fcc | bcc | bcc | bcc + Ω-hcp | bcc + Ω-hcp | bcc + Ω-hcp | bcc + Ω-hcp + amorph |
| Abrasion Resistance (%) | 100.0 | 60.0 | 80.2 | 113.2 | 116.0 | 129.2 | 97.2 |
| Chroma | 3.6 | 0.21 | 1.0 | 0.8 | 0.4 | 0.2 | 0.0 |
| Reflectivity (%) | 56.6 | 50.5 | 50.9 | 51.6 | 54.7 | 53.9 | 57.0 |

EXAMPLES

Crystal Structure

The co-sputtering generates thin film coatings of Cr doped with another metal (Zr in the case of most of what is described here, but alternatively also Ti or Co, or less preferably Hf, Ru, Y and Os). As mentioned above, dopant materials such as these modify the structure of the Cr based coating by replacing Cr atoms within the bcc crystal lattice. This modification of the atomic structure of the bcc Cr coating was observed and quantified for the preferred Zr dopant material by measuring the lattice parameter of the crystal structure using electron diffraction. The incorporation of dopant and the resulting change in lattice parameter was observed to correlate with the macroscopic abrasion resistance. Depending on the class of the dopant metal (be it bcc or hcp) at room temperature, it was found that the degree of modification of the bcc Cr crystal lattice could be controlled.

An understanding of the atomic structure of the preferred binary alloys formed in the reflective coatings of the present invention was developed by conducting electron diffraction experiments on samples using a Philips CM200 Transmission Electron Microscope (TEM). These samples were prepared by sputtering directly onto NaCl crystals, dissolving away the crystal in Milli-Q water, and then floating the alloy coating onto an uncoated copper TEM grid. The samples included the use of the additional hcp transition metal Ti, plus the bcc transition metals Mo and W which were investigated for comparative purposes.

The diffraction pattern from each sample was analysed in order to determine the lattice parameter, $a_0$, in the case of crystalline coatings or simply to confirm an amorphous structure when no crystalline material is observed. The experimental window for the dopant target power was chosen based on the overall maximum Bayer Ratio achieved for each dopant material. This window was in the range of 50 to 100 W. The resulting powers tested for the different alloy mixtures were Mo and W=100 W; and Co, Ti and Zr=50 W.

The dominant phase present for the solid solutions of these samples was found to be the bcc structure, however for certain samples additional phases were observed. The diffraction spectra of CrCo$_x$, CrZr$_x$ and CrTi$_x$ showed the presence of a secondary phase different from bcc as indicated by the arrows in FIG. 5. This secondary phase was identified as a Ω-hcp phase, a displacive phase transformation from the bcc phase. Further to this analysis, it was noted that amorphous material is present in the background of the diffraction patterns, with this phase being most noticeable for the CrTi$_x$ alloy (the blurred background in the CrTi$_x$ diffraction image in FIG. 5).

Figure 6:
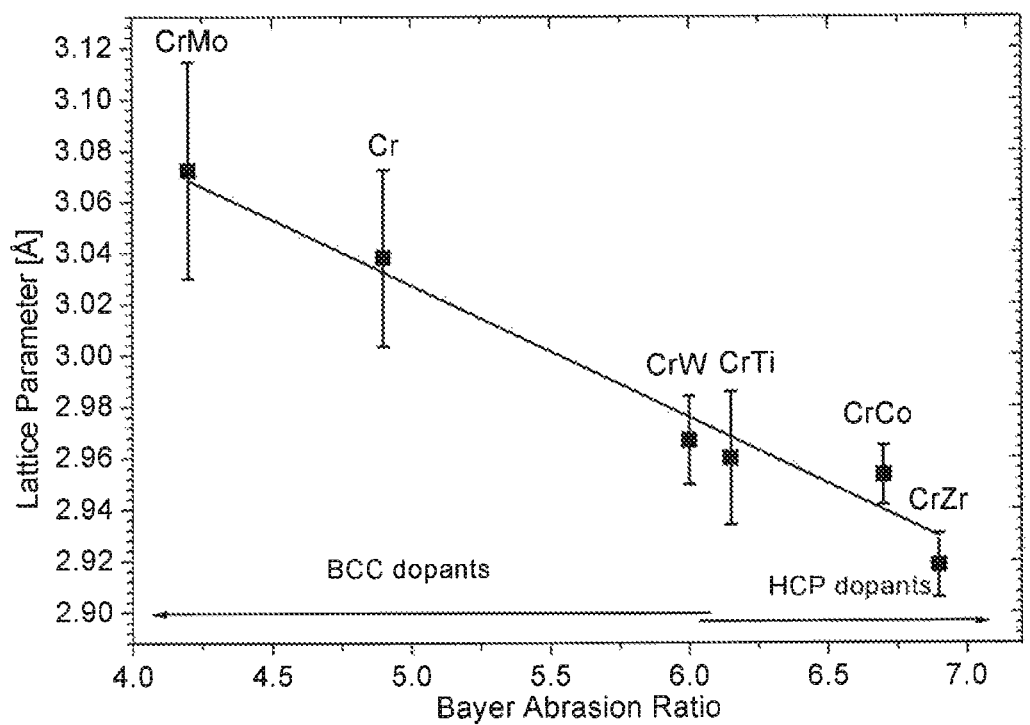
FIG. 6 shows the relationship between lattice parameter and abrasion resistance across the chromium based samples prepared for the examples.

The relationship between the atomic structure and the macroscopic abrasion resistance is evident in Tables 1, 2. Additionally, and as can be seen in FIG. 6, across the Cr based alloys of the samples, there is a clear trend that as the lattice parameter decreases the abrasion resistance increases. This increase in abrasion resistance is primarily attributed to the increase in packing density of the atoms.

Indeed, comparing the atomic radii of the dopant materials to that of Cr highlights that the change in lattice parameter of the CrM$_x$ alloys cannot be rationalised based on size constraints on the packing density (for example, W has a larger atomic radius yet a decrease in lattice parameter was observed for an alloy with W as the dopant material). Indeed, for transition metal alloys the electronic state of the atoms being alloyed and their electronic interaction generally play a contributing role in defining the lattice parameter. A comparison of the valence electrons for Cr ($4s^1$ and $3d^5$) with the preferred dopant materials of the present invention shows that Mo is comparable ($5s^1$ and $4d^5$), while the others have additional s-orbital and differing number of d-orbital valence electrons. The dopant materials with a differing number of valence electrons compared to Cr yielded a decrease in the lattice parameter in the alloy, while Mo (which is not one of the preferred hcp transition metals ideal for use as the dopant material) yielded an increase.

With respect to the mechanical properties of the preferred alloys of the present invention, these results contrast to other situations where the addition of dopant material with a greater number of valence electrons yields solid solution softening when alloyed with the group-VI metals of Mo and W.

While not wishing to be bound by theory, it is believed that the orbital overlap for the dopant materials with additional valence electrons increases the bonding strength in the alloy, thus yielding a reduced lattice parameter. Importantly, the bcc structure of the as-deposited Cr has been modified to a level by the dopant material where the abrasion resistance rivals that of an as-deposited fcc CrN coating (Bayer Abrasion Ratio ~7 for an as-deposited CrN$_{1.3}$ coating using the custom-built reactor on the specially prepared substrates).

Finally, the preferred dopant materials utilised in this experimental work are also able to be categorised by their room temperature equilibrium structures. Mo and W are bcc at room temperature, while Ti, Co and Zr are hcp at room temperature. The hcp dopant materials achieve a greater reduction in lattice parameter than the bcc dopant materials. Given the observation of the electron structure of the dopant material influencing the bonding strength, it is believed that the hcp dopant material's electronic structure yields higher bond strengths. In addition, and as mentioned above, these hcp dopant materials yield the preferred composite film having both the bcc and the Ω-hcp phase.

It will be appreciated that there may be other variations and modifications to the compositions described herein that are also within the scope of the present invention.

The invention claimed is:

1. A chromium-based reflective coating for a polymeric substrate, wherein the coating has a thickness of 200 nm or less and is an alloy of chromium and a dopant material, the dopant material being selected from the hexagonally close-packed transition metals, the alloy having a crystal structure of a primary body-centered cubic phase in coexistence with a secondary omega hexagonally close-packed phase; wherein the alloy is a binary alloy of chromium and the dopant material, and wherein the atomic percentage of the dopant material in the binary alloy is in the range of from about 1.9 at.% to about 5.8 at.%.

2. A chromium-based reflective coating according to claim 1, wherein the thickness of the coating is selected from (a) a coating of 100 nm or less; (b) a coating in the range of from 40 nm to 80 nm; (c) a coating being in the range of from 50 nm to 70 nm; and (d) a coating of about 60 nm.

3. A polymeric substrate coated with the chromium-based reflective coating of claim 1.

4. A coated polymeric substrate according to claim 3, wherein the polymeric substrate is formed from a material selected from the group of polyacrylate, polyester, polystyrene, polyethylene, polypropylene, polyamides, polyimides, polycarbonate, epoxy, phenolic, acrylonitrile-butadiene-styrene, acrylonitrile-styrene-acrylates, acetal, polycarbonate, poly (2,2'-dihydroxyphenylpropane) carbonate, polydiethyleneglycol bis(allyl carbonate), polymethylmethacrylate and polystyrene, and blends thereof.

5. A coated polymeric substrate according to claim 3, wherein the polymeric substrate includes a pre-coated film in the form of either a hardcoat, an inorganic oxide, or a thin metal film, or a combination of such pre-coated films.

6. A chromium-based reflective coating according to claim 1, wherein the coating exhibits an abrasion resistance percentage greater than 100%, where 100% abrasion resistance is defined as the abrasion of a chromium nitride coating on an identical substrate.

7. A chromium-based reflective coating according to claim 1, wherein the dopant material is selected from the hexagonally close-packed transition metals of zirconium, titanium, cobalt, hafnium, rubidium, yttrium and osmium.

8. A chromium-based reflective coating according to claim 7, wherein the dopant material is selected from the hexagonally close-packed transition metals zirconium, titanium, and cobalt.

9. A chromium-based reflective coating according to claim 8, wherein the alloy is a binary alloy and the dopant material is selected from:
   zirconium, with the atomic percentage of the zirconium in the binary alloy being in the range of from about 4.5 at.% to about 5.8 at.%;
   titanium, with the atomic percentage of the titanium in the binary alloy being in the range of from about 1.9 at.% to about 5.8 at.%; and
   cobalt, with the atomic percentage of the cobalt in the binary alloy being in the range of from about 1.9 at.% to 5.7 at.%.

10. A polymeric substrate coated with the chromium-based reflective coating of claim 8.

11. A method of forming a chromium-based reflective coating on a polymeric substrate, the method including applying chromium and a dopant material to the polymeric substrate by physical vapour deposition, the dopant material being selected from the hexagonally close-packed transition metals, to form an alloy coating having a thickness of 200 nm or less, and the alloy coating being applied so as to have a crystal structure of a primary body-centered cubic phase in coexistence with a secondary omega hexagonally close-packed phase; wherein the alloy is a binary alloy of chromium and the dopant material, and wherein the atomic percentage of the dopant material in the binary alloy is in the range of from about 1.9 at.% to about 5.8 at.%.

12. A method according to claim 11, wherein the dopant material is selected from the hexagonally close-packed transition metals zirconium, titanium, cobalt, hafnium, rubidium, yttrium and osmium.

13. A method according to claim 12, wherein the dopant material is selected from the hexagonally close-packed transition metals zirconium, titanium and cobalt.

14. A method according to claim 11, wherein the alloy is a binary alloy and the dopant material is selected from:
   zirconium, with the atomic percentage of the zirconium in the binary alloy being in the range of from about 4.5 at.% to about 5.8 at.%;
   titanium, with the atomic percentage of the titanium in the binary alloy being in the range of from about 1.9 at.% to about 5.8 at.%; and
   cobalt, with the atomic percentage of the cobalt in the binary alloy being in the range of from about 1.9 at.% to 5.7 at.%.

15. A method according to claim 11, wherein the thickness of the coating is selected from (a) a coating of 100 nm or less; (b) a coating in the range of from 40 nm to 80 nm; (c) a coating being in the range of from 50 nm to 70 nm; and (d) a coating of about 60 nm.

16. A method according to claim 11, wherein the physical vapour deposition is conducted by magnetron sputtering, utilizing a target system selected from (a) a primary alloy target or (b) two alloy targets, each of the two alloy targets being made from one of the chromium or the dopant material.

17. A method according to claim 11, wherein the physical vapour deposition is conducted by using thermal evaporation or e-beam evaporation.

18. A polymeric substrate coated in accordance with the method of claim 11.

19. A polymeric substrate coated in accordance with the method of claim 13.

* * * * *